US007948082B2

(12) United States Patent
Segal et al.

(10) Patent No.: US 7,948,082 B2
(45) Date of Patent: May 24, 2011

(54) METHOD OF FABRICATING A PATTERNED NANOSCOPIC ARTICLE (75) Inventors: Brent M. Segal, Woburn, MA (US); Thomas Rueckes, Boston, MA (US); Claude L. Bertin, Burlington, VT (US)

(73) Assignee: Nantero, Inc., Woburn, MA (US)

( * ) Notice: Subject to any disclaimer, the term of this patent is extended or adjusted under 35 U.S.C. 154(b) by 350 days.

(21) Appl. No.: 12/195,675

(22) Filed: Aug. 21, 2008

(65) Prior Publication Data
US 2009/0051032 A1 Feb. 26, 2009

Related U.S. Application Data (63) Continuation of application No. 10/936,119, filed on Sep. 8, 2004, now Pat. No. 7,416,993.

(60) Provisional application No. 60/501,033, filed on Sep. 8, 2003, provisional application No. 60/503,099, filed on Sep. 15, 2003.

(51) Int. Cl.
*H01L 23/48* (2006.01)
*H01L 21/302* (2006.01)
*D01F 9/12* (2006.01)

(52) U.S. Cl. .............. 257/746; 257/E23.141; 423/447.1; 438/742; 997/767; 997/856

(58) Field of Classification Search .................. None
See application file for complete search history.

(56) References Cited

U.S. PATENT DOCUMENTS

| 4,979,149 A | 12/1990 | Popovic et al. |
| 6,057,637 A | 5/2000 | Zettl et al. |
| 6,100,109 A | 8/2000 | Melzner et al. |
| 6,128,214 A | 10/2000 | Kuekes et al. |
| 6,250,984 B1 | 6/2001 | Jin et al. |
| 6,256,767 B1 | 7/2001 | Kuekes et al. |
| 6,277,318 B1 | 8/2001 | Bower et al. |
| 6,314,019 B1 | 11/2001 | Kuekes et al. |
| 6,342,276 B1 | 1/2002 | You |

(Continued)

FOREIGN PATENT DOCUMENTS

GB 2 364 933 A 2/2002

(Continued)

OTHER PUBLICATIONS

U.S. Appl. No. 10/341,005, filed Jan. 13, 2003, Ward.

(Continued)

*Primary Examiner* — Alonzo Chambliss
(74) *Attorney, Agent, or Firm* — Wilmer Cutler Pickering Hale and Dorr LLP (57) ABSTRACT Nanowire articles and methods of making the same are disclosed. A conductive article includes a plurality of intercontacting nanowire segments that define a plurality of conductive pathways along the article. The nanowire segments may be semiconducting nanowires, metallic nanowires, nanotubes, single walled carbon nanotubes, multi-walled carbon nanotubes, or nanowires entangled with nanotubes. The various segments may have different lengths and may include segments having a length shorter than the length of the article. A strapping material may be positioned to contact a portion of the plurality of nanowire segments. The strapping material may be patterned to create the shape of a frame with an opening that exposes an area of the nanowire fabric. Such a strapping layer may also be used for making electrical contact to the nanowire fabric especially for electrical stitching to lower the overall resistance of the fabric.

32 Claims, 7 Drawing Sheets

U.S. PATENT DOCUMENTS

| | | | |
|---|---|---|---|
| 6,409,567 B1 | 6/2002 | Amey, Jr. et al. | |
| 6,423,583 B1 | 7/2002 | Avouris et al. | |
| 6,426,687 B1 | 7/2002 | Osborn | |
| 6,443,901 B1 | 9/2002 | Fraser | |
| 6,445,006 B1 | 9/2002 | Brandes et al. | |
| 6,495,116 B1 | 12/2002 | Herman | |
| 6,495,258 B1 | 12/2002 | Chen et al. | |
| 6,515,339 B2 | 2/2003 | Shin et al. | |
| 6,528,020 B1 | 3/2003 | Dai et al. | |
| 6,548,841 B2 | 4/2003 | Frazier et al. | |
| 6,574,130 B2* | 6/2003 | Segal et al. | 365/129 |
| 6,630,772 B1 | 10/2003 | Bower et al. | |
| 6,643,165 B2* | 11/2003 | Segal et al. | 365/151 |
| 6,645,628 B2 | 11/2003 | Shiffler, Jr. et al. | |
| 6,706,402 B2 | 3/2004 | Rueckes | |
| 6,707,098 B2 | 3/2004 | Hofmann et al. | |
| 6,803,840 B2 | 10/2004 | Hunt et al. | |
| 6,808,746 B1 | 10/2004 | Dai et al. | |
| 6,809,462 B2 | 10/2004 | Pelrine et al. | |
| 6,833,558 B2 | 12/2004 | Lee et al. | |
| 6,835,591 B2* | 12/2004 | Rueckes et al. | 438/99 |
| 6,858,197 B1 | 2/2005 | Delzeit | |
| 6,863,942 B2 | 3/2005 | Ren et al. | |
| 6,899,945 B2 | 5/2005 | Smalley et al. | |
| 6,918,284 B2 | 7/2005 | Snow et al. | |
| 6,919,592 B2* | 7/2005 | Segal et al. | 257/209 |
| 6,919,740 B2 | 7/2005 | Snider | |
| 6,921,575 B2 | 7/2005 | Horiuchi et al. | |
| 6,924,538 B2 | 8/2005 | Jaiprakash et al. | |
| 6,946,410 B2 | 9/2005 | French et al. | |
| 6,955,937 B1 | 10/2005 | Burke et al. | |
| 6,969,651 B1 | 11/2005 | Lu et al. | |
| 7,056,758 B2* | 6/2006 | Segal et al. | 438/50 |
| 7,057,402 B2 | 6/2006 | Cole et al. | |
| 7,097,906 B2 | 8/2006 | Gardner | |
| 7,298,016 B2* | 11/2007 | Segal et al. | 257/415 |
| 7,416,993 B2 | 8/2008 | Segal et al. | |
| 7,566,478 B2 | 7/2009 | Ward et al. | |
| 7,781,862 B2* | 8/2010 | Bertin et al. | 257/529 |
| 2001/0004979 A1 | 6/2001 | Han et al. | |
| 2002/0160111 A1 | 10/2002 | Sun et al. | |
| 2003/0004058 A1 | 1/2003 | Li et al. | |
| 2003/0122111 A1 | 7/2003 | Glatkowski | |
| 2003/0177450 A1 | 9/2003 | Nugent | |
| 2003/0200521 A1 | 10/2003 | DeHon et al. | |
| 2004/0005723 A1 | 1/2004 | Empedocles et al. | |
| 2004/0007528 A1 | 1/2004 | Bakajin et al. | |
| 2004/0023253 A1 | 2/2004 | Kunwar et al. | |
| 2004/0031975 A1 | 2/2004 | Kern et al. | |
| 2004/0041154 A1 | 3/2004 | Watanabe et al. | |
| 2004/0043527 A1 | 3/2004 | Bradley et al. | |
| 2004/0071949 A1 | 4/2004 | Glatkowski et al. | |
| 2004/0087162 A1* | 5/2004 | Vogeli | 438/694 |
| 2004/0099438 A1 | 5/2004 | Arthur et al. | |
| 2004/0104129 A1 | 6/2004 | Gu et al. | |
| 2004/0181630 A1 | 9/2004 | Jaiprakash et al. | |
| 2004/0238907 A1 | 12/2004 | Pinkerton et al. | |
| 2004/0253167 A1 | 12/2004 | Silva et al. | |
| 2004/0265550 A1 | 12/2004 | Glatkowski et al. | |
| 2005/0053525 A1 | 3/2005 | Segal et al. | |
| 2005/0065741 A1 | 3/2005 | Segal et al. | |
| 2005/0068128 A1 | 3/2005 | Yip | |
| 2005/0095938 A1 | 5/2005 | Rosenberger et al. | |
| 2006/0237537 A1 | 10/2006 | Empedocles et al. | |
| 2006/0237799 A1 | 10/2006 | Lu et al. | |
| 2006/0278902 A1 | 12/2006 | Sun et al. | |
| 2007/0004191 A1 | 1/2007 | Gu et al. | |

FOREIGN PATENT DOCUMENTS

| | | |
|---|---|---|
| GB | 2364933 | 2/2002 |
| JP | 2000203821 | 7/2000 |
| JP | 2001-035362 A2 | 2/2001 |
| JP | 2004-090208 A2 | 3/2004 |
| WO | WO-98/39250 | 9/1998 |
| WO | WO-98/39250 A1 | 9/1998 |
| WO | WO-99/65821 A1 | 12/1999 |
| WO | WO-00/48195 | 8/2000 |
| WO | WO-01/03208 A1 | 1/2001 |
| WO | WO-02/45113 A1 | 6/2002 |
| WO | WO-02/48701 A2 | 6/2002 |
| WO | WO-03/016901 A1 | 2/2003 |
| WO | WO-03/034142 | 4/2003 |

OTHER PUBLICATIONS

Ajayan, P. M. et al., "Applications of Carbon Nanotubes", Carbon Nanotubes, vol. 80, pp. 391-425, 2001.

Avouris, P., et al., "Carbon Nanotube Electronics," Chemical Physics, 2002, vol. 284, pp. 429-445.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. M. et al., "Monodisperse Multiwall Carbon Nanotubes Obtained with Ferritin as Catalyst", Nano Letters, vol. 2, No. 6, pp. 665-667, 2002.

Bradley, K. et al., "Flexible Nanotube Electronics," *Nano Letters*, vol. 3, No. 10, pp. 1353-1355, 2003.

Cassell, A. M. et al., "Large Scale CVD Synthesis of Single-Walled Carbon Nanotubes", J. Phys. Chem. B, pp. 6484-6492, 1999.

Chen, B. et al., "Heterogeneous Single-Walled Carbon Nanotbue Catalyst Discovery and Optimization", Chem. Mater., vol. 14, pp. 1891-1896, 2002.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Dai, H. et al., "Controlled Chemical Routes to Nanotube Artchitectures, Physics, and Devices", J. Phys. Chem. B, vol. 103, pp. 1126-11255, 1999.

Dequesnes, M. et al., "Calculation of pull-in voltages for carbon-nanotube-based nanoelectromechanical switches," *Nanotechnology*, Jan. 22, 2002, vol. 13, pp. 383-386.

Desai et al., "Freestanding Carbon Nanotube Specific Fabrication", *Proc. of 2005, 5th IEEE Conf., Nanotech*, Nagoya, Japan, pp. 1-4, Jul. 2005.

Franklin, N. R. et al., "An Enhanced CVD Approach to Extensive Nanotube Networks with Directionality", Advanced Materials, 5 pages, 2000.

Hafner, J. H. et al., "Catalytic growth of single-wall carbon nanotubes from metal particles", Chemical Physics Letters, vol. 296, pp. 195-202, Oct. 30, 1998.

Homma, Y. et al., "Single Walled Carbon Nanotube Growth on Silicon Substrates Using Nanoparticle Catalysts", Jpn. J. Appl. Phys., vol. 41, Pt. 2, No. 1A/B, pp. L89-L91, 2002.

Joselevich, E., "Vectorial Growth of Metallic and Semiconducting Single-Wall Carbon Nanotubes", Nano Letters, vol. 0, No. 0, A-E, 2002.

Kaneto et al., "Electrical conductivities of multi-wall carbon nano tubes", *Synthethic Materials*, Elsevier Science, SA., vol. 203, pp. 2543-2546, 1999.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors," Science, 2000, vol. 287 pp. 622-625.

Li, J. et al., "Carbon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y., et al., "Preparation of Monodispersed Fe-Mo Nanoparticles as the Catalyst for CVD Synthesis of Carbon Nanotubes", Chem. Mater., vol. 13. pp. 1008-1014, 2001.

Nerushev, O. A., et al., "Carbon nanotube films obtained by thermal chemical vapour deposition", J. Mater. Chem., vol. 11, pp. 1122-1132, 2001.

Onoa, G.B. et al., "Bulk production of singly dispersed carbon nanotubes with prescribed lengths," Nanotechnology, vol. 16, pp. 2799-2803, 2005.

Parikh, K. et al., "Flexible vapour sensors using single walled carbon nanotubes", Sensors and Actuators B, vol. 113, pp. 55-63, 2006.

Peigney, M. et al., "A Study of the Formation of Single- and Double-Walled Carbon Nanotubes by a CVD Method", J. Phys. Chem. B., vol. 105, pp. 9699-9710, 2001.

Qi, P. et al., "Toward Large Arrays of Multiplex Functionalization Carbon Nanotube Sensors for Highly Sensitive and Selective Molecular Detection," *Nano Lett.* 2003, vol. 3(3), pp. 347-351.

Sotiropoulou, S. et al., "Carbon nanotube array-based biosensor", Anal. Bioanal. Chem, vol. 375, pp. 103-105, 2003.

Stadermann, M. et al., "Nanoscale study of conduction through carbon nanotube networks," *Phys. Rev. B 69*, 201402(R), 2004.

Valentini, L. et al., "Sensors for Sub-ppm $NO_2$ Gas Detection Based on Carbon Nanotube Thin Films," *Applied Physics Letters*, 2003, vol. 82(6), pp. 961-963.

Zhang et al., "Formation of metal nanowires on suspened signel-walled carbon nanotubes", *Appl. Phys. Lett.*, vol. 77, p. 3015, Nov. 2000.

Zhang, Y. et al., "Metal coating on suspended carbon Nanotubes and its implication to metal-tube interaction", Chemical Physics Letters, vol. 331, pp. 35-41, 2000.

Zhang, Z. et al.,"Select Pathways to Carbon Nanotube Film Growth", Advanced Materials, 4 pages, Jun. 19, 2001.

Zhao, Y. P. et al., Frequency-dependent electrical transport in carbon nanotubes, Physical Review B., vol. 64, pp. 201402-1 to 201402-4, 2001.

Ago et al., "Work Function of PUrified and Oxidised Carbon Nanotubes," Synthetic Metals, vol. 103, pp. 2494-2495 (1999).

Banerjee et al., "Functionalization of Carbon Nanotubes with a Metal-Containing Molecular Complex," Nano Letters, vol. 2, No. 1, pp. 49-53 (2002).

Haddon et al., "Purification and Separation of Carbon Nanotubes," MRS Bulletin, pp. 252-259, Apr. 2004.

Internatinal Search Report for PCT/U2005/045316, Sep. 6, 2006, 2 pages.

International Search Report and Written Opinion for Internaitonal Patent Application No. PCT/US05/18467, Oct. 1, 2007.

International Search Report, International Patent Application No. PCT/US05/18539, Sep. 18, 2006, 4 pages.

Jeong et al., "A New Purification Method of Single-Wall Carbon Nanotubes Using H2S and O2 Mixutre Gas," Chemical Physics Letters, vol. 344, pp. 18-22, Aug. 17, 2001.

Shelimov, Konstantin B., et al., "Purification of Single-Wall Carbon Nanotubes by Ultrasonically Assisted Filtration," Chemical Physics Letter, 282, Jan. 23, 1998, pp. 429-434.

Ago, H.et al., "Workfunction of Purified and Oxidised Carbon Nanotubes," Synthetic Metals 103, 1999, pp. 2494-2495.

Banerjee, et al., "Functionalization of Carbon Nanotubes with a Metal-Containing Molecular Complex," Nano Letters, 2002, vol. 2, No. 1, pp. 49-53.

Chiang, I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 1157-1161.

Delzeit, L., et al., "Multilayered Metal Catalysts for Controlling the Density of Single-walled Carbon Nanotube Growth." Chemical Physics Letters, 348, 2001, pp. 368-374.

Haddon, R.C., et al., "Purification and Separation of Carbon Nanotubes" MRS Bulletin, Apr. 2004, pp. 252-259.

Jeong, et al., "A new purification method of single-wall carbon nanotubes using $H_2S$ and $O_2$ mixture gas" Chemical Physics Letters, 2001, 344, pp. 18-22.

Kahn, et al., "Solubilization of Oxidized Single-Walled Carbon Nanotubes in Organic and Aqueous Solvents through Organic Derivation," 2002, vol. 2, No. 11, pp. 1215-1218.

Niu, et al., "High Power Electromechanical Capacitors based on Carbon Nanotube Electrodes," Appl. Phys. Lett., 70 (11), Mar. 1997, pp. 1480-1482.

Shelimov, et al., "Purification of single-wall carbon nanotubes by ultrasonically assisted filtration" Chemical Physics Letters, 1998, 282, pp. 429-434.

* cited by examiner

METHOD OF FABRICATING A PATTERNED NANOSCOPIC ARTICLE

CROSS-REFERENCE TO RELATED APPLICATIONS

This application is a continuation of and claims priority under 35 U.S.C. §120 to U.S. patent application Ser. No. 10/936,119, filed on Sep. 8, 2004, now U.S. Pat. No. 7,416, 993), entitled Patterned Nanoscopic Articles on a Substrate and Methods" of Making the Same, which claims priority under 35U.S.C. §119(e) of U.S. Provisional Patent Application No. 60/501,033, filed Sep. 8, 2003, and 60/503,099, filed Sep. 15, 2003, both entitled Patterning of Nanoscopic Articles, which are each hereby incorporated by reference in their entireties.

This application is related to the following references, which are assigned to the assignee of this application, and are hereby incorporated by reference in their entirety:

Methods of Nanotube Films and Articles (U.S. patent application Ser. No. 10/128,117), filed on Apr. 23, 2002, now U.S. Pat. No. 6,835,591; and Non-Volatile Electromechanical Field Effect Devices and Circuits Using Same and Methods of Forming Same (U.S. patent application Ser. No. 10/864,186), filed on Jun. 9, 2004, now U.S. Pat. No. 7,115,801.

BACKGROUND

1. Technical Field

This invention relates in general to the patterning of nanoscopic materials, films, fabrics, layers, and articles and in particular to the patterning of nanowires, nanotubes, nanoclusters and mixtures of nanotubes and nanowires.

2. Discussion of Related Art

Nanowires are used for electronic conductors and semiconductors as well as for light emitters, sensors, including bio sensors, etc.

There are numerous methods of creating nanowires and there are many materials from which nanowires can be made, including, but not limited to: semiconductors such as silicon and metals as described below. Nanowires of silicon can be created by deposition of a silicon oxide film through the openings of a patterned resist film, reactive ion etching (RIE), removal of the oxide and etching of the silicon, see e.g., Namatsu, H., et al., "Fabrication of thickness-controlled silicon nanowires and their characteristics," J. Vac. Sci. Technol. B 13 (6), 1995. Silicon nanowires can be fabricated by AFM to realize lithography patterns on Si surfaces after an etching step (Legrand, B., et al., "Silicon nanowires with sub 10 nm lateral dimensions: From atomic force microscope lithography based fabrication to electrical measurements," J. Vac. Sci. Technol. B 20(3)). Iron magnetic nanowire arrays can be created by using a shadow mask for an iron evaporator and depositing iron, see Tulchinsky, D. A., et al., "Fabrication and domain imaging of iron magnetic nanowire arrays," J. Vac. Sci. Technol. A 16(3), 1998. Silver silicate nanowire arrays can be created by direct current electrodeposition into nanochannels, see e.g., Peng, X. S., et al., "Electrochemical fabrication of ordered $Ag_2S$ nanowire arrays," Materials Research Bulletin 37, 2002, 1369-1375. Li, C. P., et al. report gold-wrapped silicon nanowires with ohmic contacts, see "Silicon Nanowires Wrapped with Au Film," J. Phys Chem. B 2002, 106, 6980-6984. Cu—Co, Co—Ag and Fe—Ag nanowires can be fabricated by electrodeposition as reported by Wang, Y. W., et al., "Fabrication of Ordered Ferromagnetic Alloy Nanowire Arrays and their Magnetic Property dependence on Annealing Temperature," J. Phys/Chem. B 2002, 106, 2502-2507. Nickel and bismuth nanowires can be fabricated by electrodeposition, see Yin, A. J., et al., "Fabrication of highly ordered metallic nanowire arrays by electrodeposition," Applied Physics Letters, Vol. 79, No. 7, 2001. Nanowires of gallium arsenide can be fabricated in arrays via chemical vapor deposition in nanochannels of anodic alumina plates, see Zhang, J., et al., "Fabrication and photoluminescence of ordered GaN nanowire arrays," Journal of Chemical Physics, 115 (3), 5714-5717, 2001. Such nanowire arrays can be utilized for their photoluminescence properties. Titanium oxide nanowires can be used for photoluminescence as well, see e.g., Lei, Y., et al., "Fabrication, characterization, and photoluminescence properties of highly ordered $TiO_2$ nanowire arrays," J. Mater. Res., Vol. 16 No. 4, 1138-1144, 2001. $TiO_2$ nanowire arrays can be fabricated by anodic oxidative hydrolysis, see Lei, Y., et al., "Fabrication, characterization and Raman study of $TiO_2$ nanowire arrays prepared by anodic oxidative hydrolysis of $TiCl_3$," Chemical Physics Letters 338 (2001) 231-236. Zinc oxide nanowires arrays can be patterned in a one step electro-chemical deposition technique based on an ordered nonporous alumina membrane. See Zheng et al., "Fabrication and optical properties of large-scale uniform zinc oxide nanowire arrays by one-step electrochemical deposition technique," Chemical Physics Letters 363 (2002) 123-128. Silicon carbide nanowires can be fabricated using catalysts. See Deng et al., "Synthesis of silicon carbide nanowires in a catalyst-assisted process," Chem. Phys. Letters 356 (2002) 511-514.

Nanowires can be useful as other than electronic conductors, e.g., nanowires can be used for their phononic effects, see Ciraci, S., et al., "Quantum effects in electrical and thermal transport through nanowires," J. Phys. Condens. Matter 13 (2001) R537-R568.

Nanowires can be formed into arrays for thermometry, see Pekola, J. P., et al., "Thermometry by Arrays of Tunnel Junctions," Phys. Rev. Lett. 73, 2903.

Investigators have created nanowires out of thin, contiguous films via lithography, i.e., they have taken contiguous films and removed much of the material, leaving only very thin strips, i.e., nanoscale wires. The material from which the wires were created sat upon a sacrificial layer above a substrate and then the sacrificial material is underetched to leave suspended nanowire. See Pescini, L., et al., "Suspending highly doped silicon-on-insulator wires for applications in nanomechanics," Nanotechnology 10 (1999) 418-420.

The use of nanowire technology in sensors allows for speedier operation and radiation hardness, while maintaining compatibility with standard silicon processing and the intrinsic sensitivity to their environment creates an increasing industrial demand.

Other uses of nanowire devices include as a resonator probed by a net work analyzer and capacitance coupling (see Blick, R. H., et al., "Nanostructured silicon for studying fundamental aspects of nanomechanics," J. Phys. Condens. Matter 14 (2002) R905-R945), polymer cantilevers, mechanical oscillators for signal transduction, filtering and mixing, nanoscale actuators, suspended nanowire bridges, Coulomb blockade thermometers, etc. (see Pekola, J. P., et al., "Thermometry by arrays of tunnel junctions," Phys Rev. Lett.).

Current technology does not allow for facile fabrication of large scale nanoscopic nanowire devices; there is therefore a need in the art for a method of creating structures of patterned nanowire fabrics.

SUMMARY

The current invention relates to the patterning of nanowires. More specifically, the invention relates to the generation of nanoscopic conductive elements used for any electronic application. Patterned nanowires can be used as part of hybrid circuits involving CMOS technology and electronics. Other applications for patterned nanowires include and are not limited to: actuators, resonators, sensors, biosensors, and elements used in photonics applications, etc.

It should be noted that although the following embodiments of the invention relate to the patterning of nanowires, these embodiments are not limited only to the patterning of nanowires. Rather, the invention may also be applied to the patterning of nanoclusters. Nanowires and nanoclusters are known in the art.

According to one aspect of the invention, patterned nanoscopic articles and methods of making the same are provided.

According to one aspect of the invention, a plurality of inter-contacting nanowire segments are patterned to create an article.

According to one aspect of the invention, a plurality of inter-contacting nanowire segments are patterned to create a conductive article.

According to one aspect of the invention, the conductive article comprises a plurality of inter-contacting nanowire segments that define a plurality of conductive pathways along the article and a lithographically patterned strapping material that is positioned to contact a portion of the plurality of inter-contacting nanowire segments.

According to one aspect of the invention, the conductive article is part of an assembly including a substrate.

According to one aspect of the invention, the strapping material is a metal.

According to one aspect of the invention, the strapping material contacts the periphery of the plurality of inter-contacting nanowire segments.

According to one aspect of the invention, the strapping material is lithographically patterned in the shape of a frame with an opening that exposes an area of the plurality of inter-contacting nanowire segments.

According to one aspect of the invention, the fabric makes up a trace, which comprises an electrical network of inter-contacting nanowires defining a plurality of conductive pathways along the trace.

According to one aspect of the invention is a method of making conductive articles on a substrate, comprising: forming a nanowire fabric on the substrate, defining a pattern within the fabric in which the pattern corresponds to the conductive article, forming a strapping layer that contacts the nanowire fabric, and removing a portion of the strapping layer such that the remaining portion of the strapping layer contacts at least a portion of the nanowire fabric.

According to one aspect of the invention, the fabric includes semiconducting nanowires.

According to one aspect of the invention, the fabric includes metallic nanowires.

According to one aspect of the invention, the nanowires segments are of different lengths.

According to one aspect of the invention, the nanowire segments include segments having lengths shorter than the length of the patterned article.

According to one aspect of the invention, patterning of fabric is done by lithography.

According to one aspect of the invention, patterning of fabric is done by lithography followed by a standard etch procedure including any of the following: plasma etching, reactive ion etching, and wet etching.

According to one aspect of the invention, an intermediate layer is formed between the nanowire fabric and the strapping material.

According to one aspect of the invention, the intermediate layer is a semiconductor layer and the strapping layer is a metal layer.

According to one aspect of the invention, the strapping layer and the intermediate layer are annealed to form a conducting composite layer.

According to one aspect of the invention, a portion of the strapping layer is removed to expose a portion of the fabric.

According to one aspect of the invention, a center portion of the strapping layer is removed such that the strapping layer is in the shape of a frame with an opening that exposes an area of the fabric.

According to one aspect of the invention, strapping materials are deposited on top of or through the nanowire fabrics to enhance their properties (e.g., addition of metals to the nanowire fabrics for stitching between devices to decrease resistance).

According to one aspect of the invention, strapping materials are deposited on top of or through the nanowire fabrics to protect them during processing such as insulators, semiconductors or metals.

Under other aspects of the invention, the nanowire fabric is formed by depositing a solution of suspended nanowires on a substrate. The nanowires are deposited via spin-coating of the solution.

Under other aspects of the invention, the nanowire/nanotube fabric is formed by first depositing a solution of suspended nanowires on a substrate, then depositing a solution of nanotubes on the substrate. The order of depositions can be reversed. The nanowires and nanotubes are deposited via spin-coating of the solution.

Under yet other aspects of the invention, properties of the fabric of nanowires or the fabric of nanowires and nanotubes are controlled through the application process. For example, one application would result in a sparse fabric and multiple applications would result in increasingly dense fabric. A denser fabric could lead to a decrease in resistance or enhancement of other conductive properties.

The methods of the present invention are compatible with typical semiconductor processing.

BRIEF DESCRIPTION OF THE DRAWING

In the Drawing,

FIGS. 4A-4C illustrate steps for patterning nanowire fabrics in accordance with some embodiments of the invention; and.

DETAILED DESCRIPTION

General

Methods for patterning nanoscale articles and nanoscale features are disclosed in which nanowires or a mixture of nanowires and nanotubes are placed on or grown onto a surface and defined into patterned articles.

DEFINITIONS

The term "nanowire" as used herein is meant to describe a nanoscale particle typically of high aspect ratio, regardless of the composition or electrical conductivity of the material.

The term "nanotube" or "nanotubes" as used herein is meant to mean carbon nanotubes. Carbon nanotubes may be pristine, functionalized, or they may be filled with other material, e.g., nanowire material.

The term "functionalization," as used herein, includes both covalent and noncovalent modifications of nanotubes while the term "derivatization" signifies the covalent modification of nanotubes. Functionalization may in certain instances involve non-covalent transformation of the surface of a nanotube into a form with different functional groups or moieties. Derivatization is indicative of a covalent alteration of the chemical structure of the nanotubes. In both circumstances the process can be controlled such that the electrical properties of the nanotube may be retained. Accordingly, functionalization, as used herein, is meant to encompass any alteration to the nanotube surface which creates different physical or electrical characteristics including covalent derivatization.

By the term "monolayer fabric," the inventors mean: a non-woven fabric of nanotubes or a non-woven fabric of nanotubes and nanowires which is primarily one layer thick.

The term "trace" as used herein means a conductive or semiconductive article or any suitable conductive pathway made from nanowires and/or nanotubes. Such a trace may have been lithographically patterned from a larger fabric. The terms "ribbons" and "belts" are synonymous with "trace" when referring to articles made from patterned fabrics.

Nanowires can be applied to a surface of a substrate by any appropriate means including: by spin coating, dipping, aerosol application, or they can be grown by use of catalysts, etc. Ribbons, belts or traces made from a matted layer of nanowires or a non-woven fabric of nanowires can be used as electrically conductive elements. At points in this disclosure, the patterned fabrics are referred to as traces or electrically conductive articles. In some instances, the ribbons are suspended, and in other instances they are disposed on a substrate. In some instances, they are used to deflect to certain states under electrical control, and in other instances they do not move and instead are used simply to carry an electrical current or voltage, as well as providing excellent thermal conductivity. Numerous other applications for patterned nanowires and patterned nanowire fabrics include, but are not limited to: sensor applications, photonic and phonic uses, etc. The new nanowire belt structures are believed to be easier to build at the desired levels of integration and scale (in number of devices made) and the geometries are more easily controlled. The new nanowires ribbons are believed to be able to more easily carry high current densities without suffering the problems commonly experienced or expected with metal traces.

Under certain embodiments of the invention, electrically conductive articles may be made from a patterned nanowire fabric, layer, or film; using individual nanowires is problematic because of difficulties in growing them with suitably controlled orientation, length, and the like. Creating traces from nanowire fabrics allows the traces to retain many if not all of the benefits of individual nanowires. Moreover, traces made from nanowire fabric have benefits not found in individual nanowires. For example, since the traces are composed of many nanowires in aggregation, the trace will not fail as the result of a failure or break of an individual nanowire. Instead, there are many alternate paths through which electrons may travel within a given trace. In effect, a trace made from nanowire fabric creates its own electrical network of individual nanowires within the defined trace, each of which may conduct electrons. Moreover, by using nanowire fabrics, layers, or films, current technology may be used to create such traces. The nanowire matte is grown or deposited on a surface, such as that of a silicon wafer, to form a contiguous film of a given density. The two dimensional film can then be patterned to generate electrically conductive lines or traces ranging in width from 1 nm (or the intrinsic minimum size of a given nanowire) to hundreds of microns or greater, depending on the application and context. The pattern can be generated at multiple length and width scales to allow the interconnection of various sized semiconductor devices such as transistors or memory elements and eventually fanning out to bond pads or other interconnecting materials or constructs. The nanowire interconnects can be metallized if necessary to connect different materials because of their intrinsic properties that allow easy contact to metallic or semiconductor materials. Nanotubes may be filled with metal or other material and thereby create nanowires encapsulated within nanotube lumens, see e.g., Govindaraj, A., et al., "Metal Nanowires and Intercalated Metal Layers in Single-Walled Carbon Nanotube Bundles", *Chem. Mater.* 2000, 12, 202-205.

The traces and electrically conductive articles may be used in other forms of circuits. For example, nanowire traces may be used for their ability to withstand high current densities, normally found in very small sized traces (e.g., sub 10 nm regimes). They may also be used to reduce the likelihood of contaminating other circuit features, depending on the type of nanowire and substrate used in a given application.

While these interconnects may primarily be formed of a monolayer of nanowires, multilayer ribbons and mattes can also be envisioned using proper growth/application conditions. This requires control of parameters including, but not limited to: catalyst composition and concentration, functionalization of the underlying surface, spin coating parameters (length and RPM, for example 10-40 seconds, 50-5000 rpm), growth time, temperature and gas concentrations and spin coating solution concentration and number of applications. The nanowires are then patterned, e.g., by photolithography or nanoimprint lithography. In the case of photolithography, those nanowires which are desired are protected by solidified resist, and unprotected nanowires (those not covered by solidified resist) are removed by an appropriate etching method, e.g., by reactive ion etch, ashing or by wet etch.

Under certain embodiments of the invention, electrically conductive articles may be made from a nanowire fabric, layer, or film. Nanowires with diameters as little as 1 nm are electrical conductors or semiconductors.

Unlike the prior art which relies on directed growth or chemical self-assembly of individual nanowires, preferred embodiments of the present invention utilize fabrication techniques involving thin films and lithography. This method of fabrication lends itself to generation over large surfaces especially wafers of eight inches or even twelve inches or more. The ribbons should exhibit improved performance over individual nanowires, by providing redundancy of conduction pathways contained within the ribbons. (If an individual nanowire breaks other nanowires within the rib provide conductive paths.)

FIGS. 1A-1E illustrate steps in a method of patterning fabric made from nanowires. The nanowires may be applied by any appropriate means and the electrical characteristics of the nanowires may be controlled by controlling the composition and density of the fabric. One method of depositing a nanofabric of nanowires or nanowires and nanotubes is by deposition and spin coating. If the film is to be deposited, pre-grown nanowires or pre-grown nanowires and nanotubes may be used. For example, under certain embodiments of the invention, nanowires may be suspended in a solvent in a soluble or insoluble form and spin-coated over a surface to generate a nanowire film. In such an arrangement the film created may be one or more nanowires thick, depending on the spin profile and other process parameters. Appropriate solvents include and are not limited to: dimethylformamide, n-methylpyrollidinone, n-methyl formamide, orthodichlorobenzene, paradichlorobenzene, 1,2, dichloroethane, alcohols, water with appropriate surfactants such as sodium dodecylsulfate or TRITON X-100 or others. The nanowire concentration and deposition parameters such as surface functionalization, spin-coating speed, temperature, pH and time can be adjusted for controlled deposition of monolayers or multilayers of nanowires as required. The nanowire film could also be deposited by dipping the wafer or substrate in a solution of soluble or suspended nanowires. The film could also be formed by spraying the nanowires in the form of an aerosol onto a surface. When conditions of catalyst composition and density, growth environment, and time are properly controlled, nanowires can be made to evenly distribute over a given field that is primarily a monolayer of nanowires. In the event that nanowires are deposited on a surface at room temperature by spin-coating of a solution or suspension of nanowires then the choice of substrate materials is expanded substantially. In this case there is no high temperature step and any material typically compatible with the device using nanowire fabrics would be acceptable.

Figure 1A:
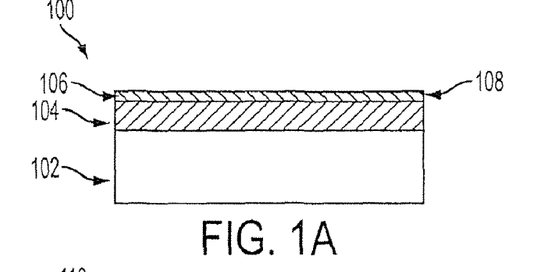
FIGS. 1A-1E illustrate steps for fabricating a patterned nanowire fabric in accordance with some embodiments of the invention.
Figure 1B:
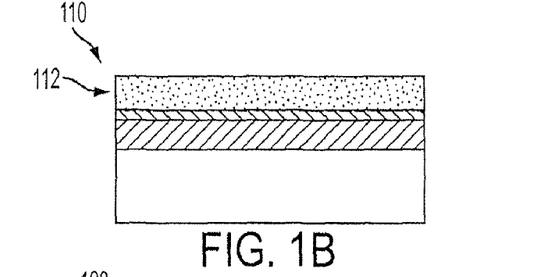
Figure 1C:
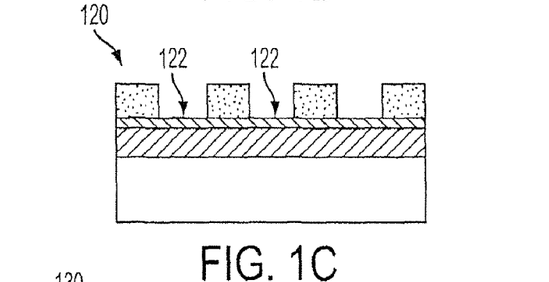
Figure 1D:
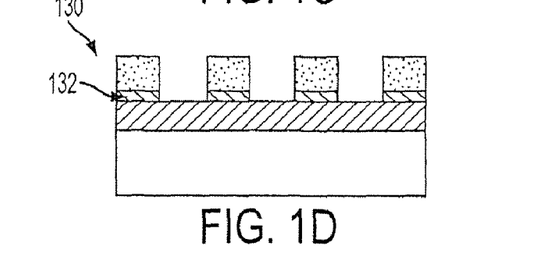

A first structure 100 is created or supplied: structure 100 having a substrate 102. The material of substrate 102 can be selected from any rigid material which can stand up to subsequent patterning steps, substrate material includes and is not limited to silicon, silicon oxide, silicon nitride, any material suitable for use with semiconductor or electronic applications, or any material appropriate for use in the field in which the patterned fabric will be used. Structure 100 further comprises optional support layer 104, which may be an insulator, and its presence and composition depend on the final use of the patterned fabric.

Figure 1E:
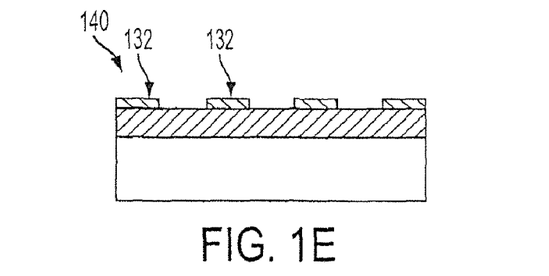
Figure 2A:
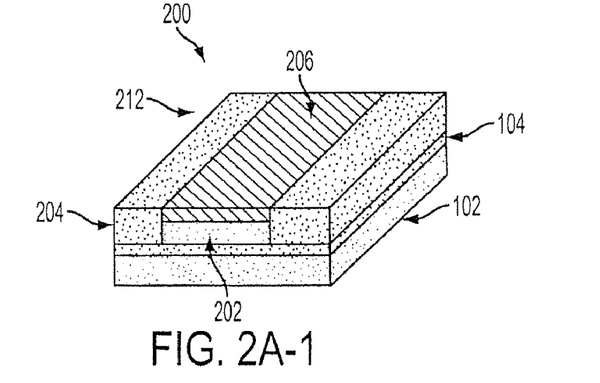
FIGS. 2A-2B illustrate steps for fabricating a suspended, patterned nanowire fabric in accordance with some embodiments of the invention.
Figure 2A:
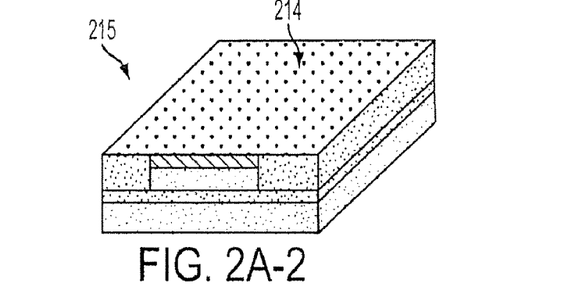
Figure 2A:
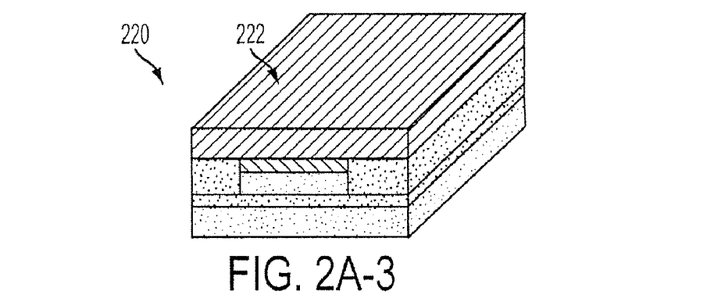
Figure 2A:
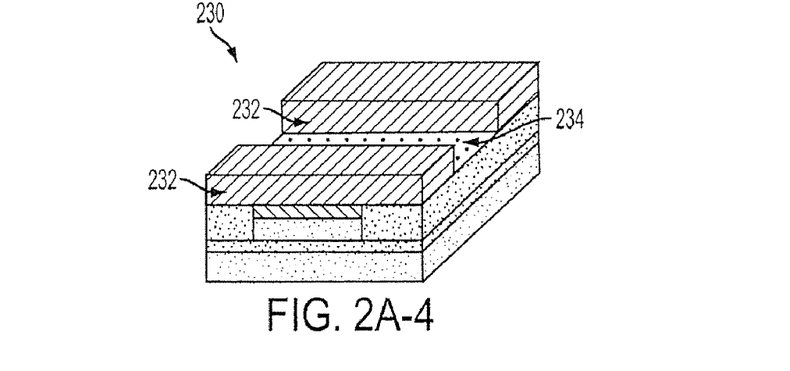
Figure 2B:
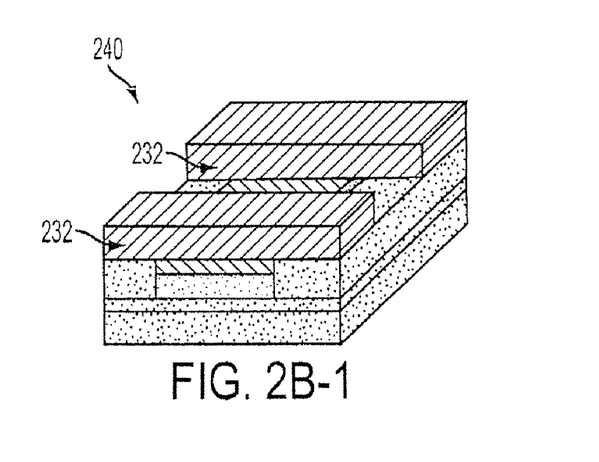
Figure 2B:
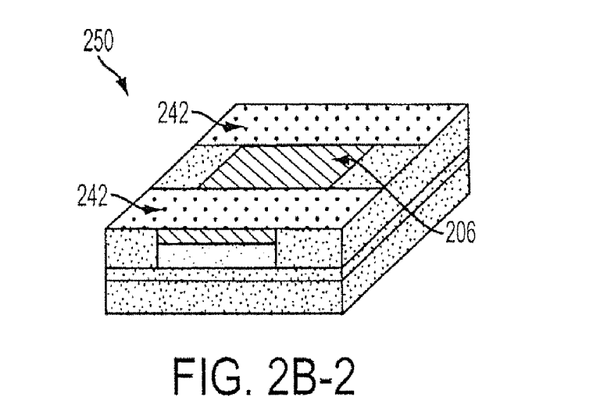
Figure 2B:
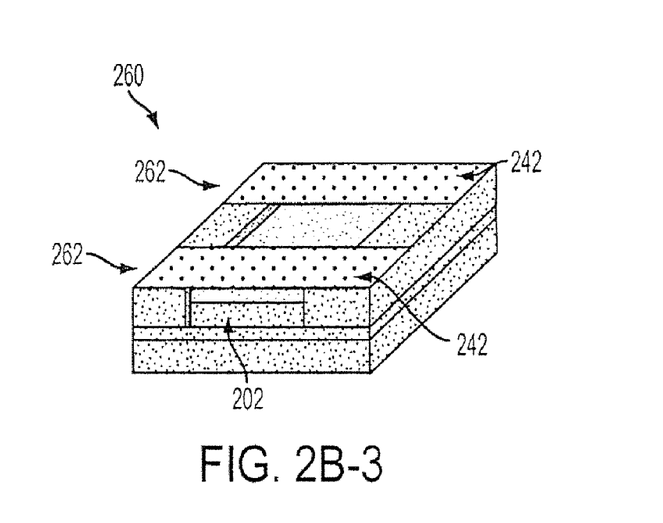

Nanowire fabric layer 106 is applied over layer 104 by any appropriate means. Topmost surface 108 of nanowire fabric layer 106 is illustrated. A resist layer 112 is applied to surface 108, e.g., by spin coating, thus forming intermediate structure 110. The resist 112 is and patterned by exposure or the like to define conductive traces, leaving portions of exposed nanowire fabric 122, thus forming intermediate structure 120. Once so defined, the exposed photoresist may be processed to remove some of the layer and to leave the traces 132, thus forming intermediate structure 130. Standard processing steps involving reactive ion etching, wet etching or other suitable techniques for removal of exposed nanowires (in this case, "exposed" nanowires are simply not covered by resist). Subsequent metallization may be used to form addressing electrodes or a fanned interconnect structure. Exposed nanowire fabric 122 is removed by any appropriate means, including but not limited to ashing, RIE or chemical wet or dry removal, leaving resist 112 above patterned nanowire portions 132, the pattern/shape of the nanowires is determined by the photomask pattern. In the example of FIGS. 2A-2B, the traces are shown as parallel straight traces, but the trace definition may take other forms. The defined traces can have a width of at least 1 nm and as much as 100 microns or more depending upon the type of device or application in which the trace is to be used. Remaining resist 112 is removed, e.g., by lift off, thereby exposing patterned nanowire fabric 132, thus forming structure 140, having patterned nanowire elements.

Intermediate structure 100 may be provided already including electronic interconnects or other functional elements as desired. Also, structure 140 may be further processed to include subsequently-created interconnects, metallizations and/or functional electronic and conductive elements.

FIGS. 2A-2B illustrate a method of making certain embodiments of suspended nanowire fabric-based elements, e.g., nano-electromechanical switches. First structure 200 is created or provided. In the illustrated embodiment, structure 200 includes a substrate 102, (made from, e.g., silicon), having an insulating layer 104 (such as silicon dioxide) and a support layer 204 ($SiO_2$ or $Si_3N_4$) that defines a plurality of supports 204. The choice of materials for the support layer depends upon the method chosen for nanowire growth and other factors. In the event that a low-temperature process is chosen for placing nanowires on the surface, one can envision utilizing such materials as $Al_2O_3$, silicon monoxide, semiconductors, insulators and polymers such as polyimide or glass. The materials selection process is confined to those materials that are compatible with the fabrication process described above. It is understood by those sufficiently skilled in the art that upon selection of a particular electrode material, the sacrificial layer and support materials naturally become limited based upon typical processing steps available in semiconductor fabrication. Likewise if a particular sacrificial layer is chosen the choices of electrode and sacrificial layer materials is suitably limited. Furthermore, upon selection of a particular support material it follows that the electrode and sacrificial layer materials choice is likewise limited. Because room temperature fabric creation methods may be used, many substrates may be used which could not be chosen, were a higher temperature catalyst-dependent fabric creation method used.

In this instance, the supports 204 are formed by rows of patterned silicon nitride, though many other arrangements are possible, such as a plurality of columns. Conductive traces 202 extend between supports 204. In this instance, the traces 202 are shown as essentially contacting the supports 204, but other arrangements are possible as are other geometries; for example, spaces may exist between trace 202 and support 204 and trace 202 may be fashioned as a wire or may have non-rectangular transverse, cross-sections, including triangular or trapezoidal cross-sections. Sacrificial layers 206 are disposed above the traces 202 so as to define one planar surface 212 with the upper surface of the supports 204. This planar surface 212, as will be explained below, will accept a matted layer of nanowire whether or not mixed with carbon nanotubes, the surface 212 may or may not be functionalized to increase or otherwise alter nanowire/nanotube adhesion as explained herein.

Once such a structure 200 is created or provided, the upper surface 212 receives a nanowire fabric layer 214, thus forming intermediate structure 215. Depending on final use of the article, this fabric may be made from a mixture of nanowire and carbon nanotube as described herein.

A matted nanowire layer 214 is a non-woven fabric of nanowires and optionally also of single-walled carbon nanotubes (SWNTs) forming intermediate structure 215. Nanofabrics may be created by applying prefabricated nanowires and or nanotubes onto a substrate, e.g., by spin coating a suspension of nanowires and or nanotubes onto a substrate. Generally, methods of applying nanotubes to substrates in order to create nanofabrics can be used to create nanofabrics of nanowires and nanowires/nanotubes, also the substrates and intermediate structures used in creating devices for numerous applications used with fabrics made from nanotubes can also be used with nanowire fabrics and nanowire/nanotube fabrics. Such methods and intermediate structures are described in applications: U.S. Ser. Nos. 09/915,093, 09/915,173, 09/915,095, 10/033,323, 10/033,032, 10/128,118, 10/128,117, 10/341,005, 10/341,055, 10/341,054, 10/341,130, 60/446,783 60/446,786 and 60/476,976, the contents of which are hereby incorporated by reference in their entireties. While single walled carbon nanotubes are preferred, multi-walled carbon nanotubes may be used in conjunction with nanowires. Layer 214 is primarily one nanowire/nanotube thick and the various wires/tubes adhere to one another via van der Waals forces.

It is an aspect of the invention to pattern nanowire fabrics grown on a substrate. When conditions of catalyst composition and density, growth environment, and time are properly controlled, nanowires and nanotubes can be made to evenly distribute over a given field that is primarily a monolayer of nanowires and nanotubes. Proper growth requires control of parameters including but not limited to catalyst composition and concentration, functionalization of the underlying surface, spin coating parameters (length, nanowire/nanotube suspension concentration and RPM), growth time, temperature and gas concentrations.

A photoresist 222 is applied over intermediate structure 215, forming intermediate structure 220. The resist is patterned, leaving solidified resist 232 and exposed fabric 234, thereby forming intermediate structure 230.

Exposed fabric 234 is removed by an appropriate etch method, including but not limited to: by RIE or by ashing, thereby forming intermediate structure 240. Solidified resist 232 sits atop and thereby defines ribbons 242 (shown below) patterned from the nanowire fabric layer 214. The ribbon patterns cross (for example, perpendicularly) the underlying traces 202. The solidified photoresist 232 is removed to leave ribbons 242 of non-woven nanowire fabric lying on planar surface 212 to form intermediate structure 250; intermediate structure 250 having exposed sacrificial layer portions 252, and patterned ribbons 242 as shown. Traces, ribbons and patterned nanofabric articles are generally meant to be used interchangeably.

Intermediate structure 250 is then treated to remove sacrificial layer 206, (e.g., with an acid, such as HF, depending on the compositions of the material used), the sacrificial layer removed includes that portion under the ribbons 242, thus forming nanowire ribbon array 262, nanowire ribbon array 262 being partially suspended over traces 202 and supported by supports 204. The resultant structure 260 having a suspended nanowire fabric-based element is shown. The sacrificial layer 206 can be constructed of $Al_2O_3$, metal oxides, salts, metals and other materials. The intermediate structure 200 can be formed using a variety of materials to form the supports 204 including spin-on-glass (SOG), $SiO_2$ and others. In the event that a low temperature spin-coating of nanowire protocol is chosen the materials suitable to be sacrificial layers expands substantially. This could include materials such as Poly(methyl methacrylate), (PMMA) or other polymers, metals such tungsten, chromium, aluminum, bismuth and other transition and main group metals. Also, other semiconductors such as germanium and insulators such as salts, oxides and other chalcogenides could be used. Because the matted layer of nanowires 214 form a non-woven fabric that is not a contiguous film, etchants or other chemicals may diffuse between the individual nanowire "fibers" and more easily reach the underlying components, such as the sacrificial layer.

Patterned nanowire ribbons may be connected to other ribbons, metallic traces or electronic features. For example, nanowire traces may be connected to nanowire traces having different feature sizes, such as width. The traces may also be connected to elements, which may be metal contacts or bonding pads.

While these interconnects may primarily be formed of a monolayer of nanowires, multilayer ribbons and mattes can also be envisioned using proper growth/deposition conditions. This requires control of parameters including but not limited to catalyst composition and concentration, functionalization of the underlying surface, spin coating parameters (length and RPM, for example), growth time, temperature and gas concentrations.

Subsequent metallization may be used to form addressing electrodes; alternatively, the nanowire fabric may be created over a substrate with previously embedded addressing electrodes.

Patterned nanofabrics may be used for their thermal conductivity and phononic properties. Potential uses are in heat sinks and in resistive heaters. The material and the size of the nanowire chosen for use in the nanofabric depends upon the desired end use. See e.g., Ciraci, S., et al., "Quantum effects in electrical and thermal transport through nanowires" J. Phys.: Condens. Matter 13 (2001) R537-R568. Other important uses involve three dimensional through-wafer interconnects and thermal transfer between substrates.

The above techniques, i.e., the various growth, spin-coating, patterning, and etching operations may be performed using conventional, lithographic patterning techniques. Currently, this may result in feature sizes (e.g., width of ribbon 101) of about 180 nm to as low as 22 nm, but the physical characteristics of the components are amenable to even smaller feature sizes if manufacturing capabilities permit.

Nanowire fabrics may be applied by such methods as spin-coated catalyst-based growth, gas-phase catalyst-assisted CVD and spin-coating or direct deposition of nanowires. In the case of the catalyst-based growth as has been described above the catalyst is distributed on the surface either by spin-coating, or dipping the substrate in the catalyst material followed by standard washing protocols. In each of these cases the nanowires are then grown via any appropriate method.

Because the growth process causes the underside of such nanowires to be in contact with planar surface 306 of intermediate structure 302, they exhibit a "self-assembly" trait. In particular, individual nanowires tend to adhere to the surface on which they are grown whenever energetically favorable, such that they form substantially as a "monolayer." Some nanowires may grow over another so the monolayer is not expected to be perfect. The individual nanowires do not "weave" with one another but can adhere with one another as a consequence of van der Waals forces; such van der Waals forces are attractive. In other embodiments of the present invention, the van der Walls interactions between the nanowires that comprise the nanofabric may be repulsive or neutral, depending upon the desired application. The nanowires of the present invention may be functionalized to alter and or enhance the van der Walls interactions as well. In certain applications the nanowire fabric will be thicker than a monolayer and can be made much thicker even as high as 1 micron or greater for applications which require particular resistive properties.

Properties of the nanowire fabric can be controlled through deposition techniques. Once deposited, the nanofabrics can then be patterned and etched to generate nanowire traces. Nanowire fabrics can be generated through growth directly upon a substrate or through direct application to a substrate. In the case of application, the types of substrates which can be used are nearly limitless since the application procedure occurs at room temperature. This allows for such diverse substrates as plastics, glass or flexible materials to be used.

Monolayer nanowire fabrics can be achieved through specific control of growth or application density. More nanowires can be applied to a surface to generate thicker fabrics with less porosity. Such thick layers, up to a micron or greater, may be advantageous for applications which require lower resistance.

In certain embodiments, nanowires are applied substantially unrestrained in the x- and y-axis directions, but are substantially restricted in the z-axis (perpendicular to the underlying substrate) as a consequence of the self-assembly trait. Other embodiments may supplement the above approach to growing nanowire layer 214 with the use of field-oriented or flow-oriented growth techniques. Such supplementation may be used to further tailor growth such that any growth in one planar axis (e.g., the −x-axis) is retarded. This allows for a more even coverage of the desired area with a planar interwoven monolayer coating of nanowires with a controllable density.

Nanowire fabrics can be characterized in a variety of ways including through measurement of their electrical properties. Determination of the resistance of a nanowire fabric per square would be a typical characterization measurement. For thinner and more porous nanowire fabrics a typical resistance measurement would be 1-10 k$\Omega$/□. For more dense nanowire fabrics the typical resistance could range from 20 milli$\Omega$/□ to 1 k$\Omega$/□ with a preferred embodiment having a density of around 10-50$\Omega$/□ for a typical thick nanowire fabric.

Nanowire fabrics can be quite porous allowing material to be etched from below the fabric itself. In this instance the use of a sacrificial etchant layer would allow the nanowire fabric to be suspended between two supports. Such an orientation of a nanowire fabric could furthermore be firmly pinned to the supports by evaporation of an additional material onto the nanowire fabric. This material which can be composed of insulators, semiconductors or conductors can be evaporated through a porous nanowire fabric to prevent the nanofabric from dislodging from the supports. Such a pinning support layer may also be used for making electrical contact to the nanowire fabric especially for electrical stitching to lower the overall resistance of a nanowire trace. Non-limiting examples of materials that may be used in such a pinning embodiment include silicon dioxide, silicon nitride, silicon, aluminum, tungsten, titanium, copper, gold, silver, molybdenum and others.

The above embodiments of the present invention and addressing lines can be addressed/connected using traces or electrically conductive articles made from nanowire layers 214, traces made from patterned carbon nanotubes or made of any appropriate material. The layers may have thickness of about 1 nm or less, i.e., the thickness of a given nanowire. The nanowire matte 214 is grown or deposited on a surface, such as that of a silicon wafer, to form a contiguous film of a given density. The two dimensional fabric can then be patterned to generate electrically conductive lines or traces ranging in width from 1 nm to hundreds of microns or greater, depending on the application and context. The pattern can be generated at multiple length and width scales to allow for appropriate desired end use, including but not limited to: the interconnection of various sized semiconductor devices such as transistors or memory elements and eventually fanning out to bond pads or other interconnecting materials or constructs sensor applications, actuators, transistors, diodes, triodes and pentodes. The nanowire interconnects can be metallized if necessary to connect different materials because of their intrinsic properties that allow easy contact to metallic or semiconductor materials.

Figure 3A:
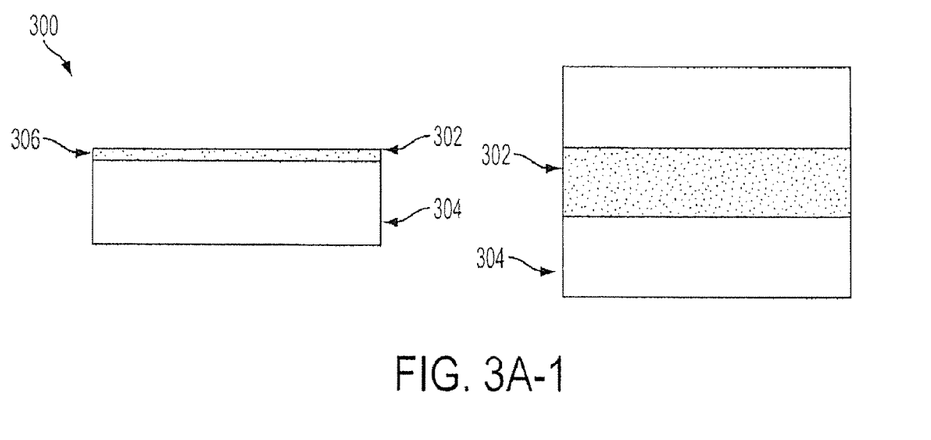
FIGS. 3A-3B illustrate steps for fabricating a framed portion of patterned nanowire fabric using a strapping material in accordance with some embodiments of the invention.
Figure 3A:
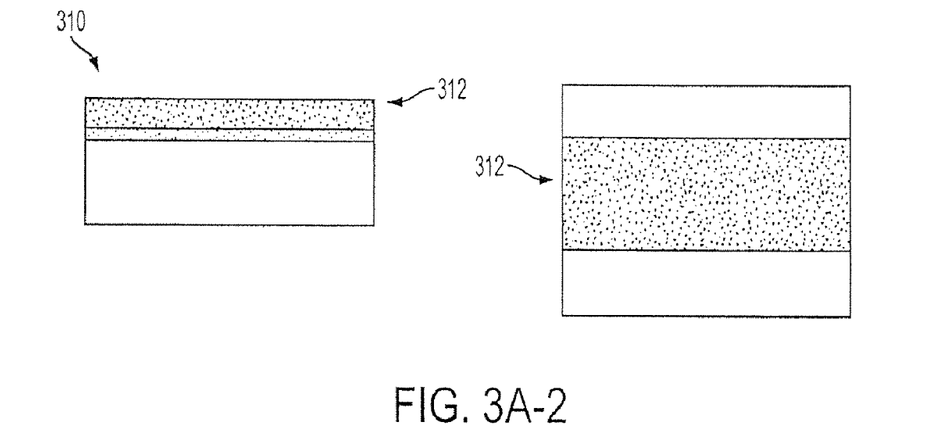
Figure 3A:
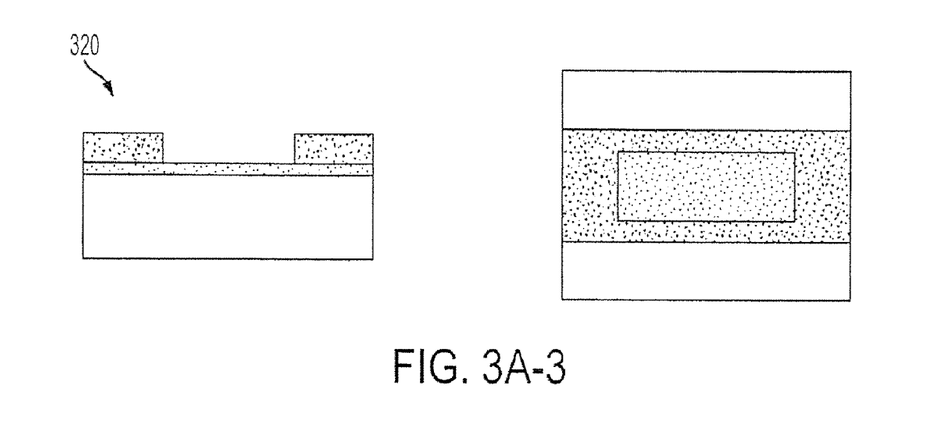
Figure 3B:
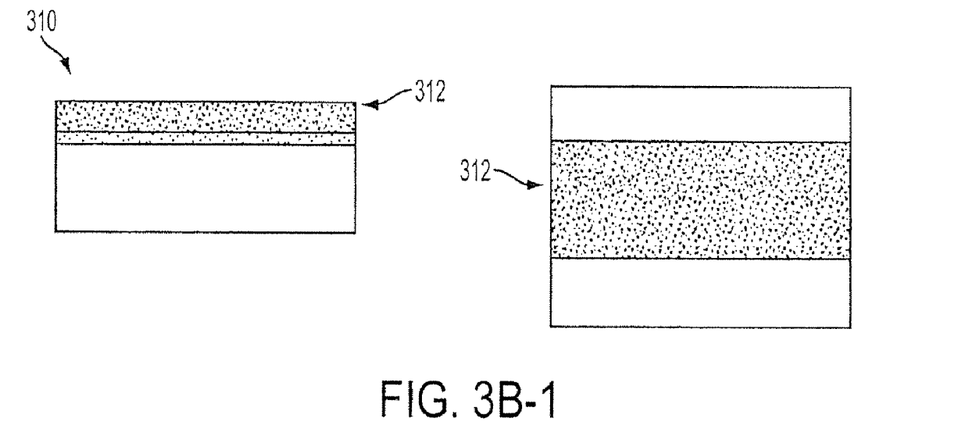
Figure 3B:
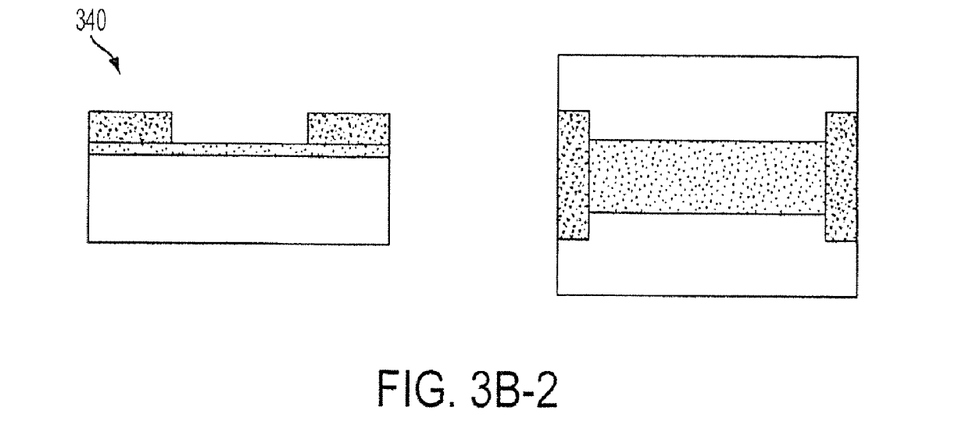

Further methods of patterning nanowires or nanowire/nanotube composites involve use of strapping material. FIGS. 3A-1-3A-3 illustrate a method of using a strapping material to create a framed portion of patterned fabric and a method of its creation. Such a framed fabric may be created by creating the fabric 302 on a substrate 304, as illustrated by intermediate structure 300, covering the fabric 302 with an appropriate covering material 312, as shown illustrated by intermediate structure 310, and lithographically patterning and removing a section of the covering material 312, leaving a "frame" of material around sensing fabric, as illustrated by structure 320. Such a strapping method is more fully described in "Nonvolatile Electromechanical Field Effect Transistors and Methods of Forming Same" U.S. Provisional Patent Application No. 60/476,976, filed on Jun. 9, 2003. The covering material may be conductive, and may act to alter the electrical properties of the entire patterned fabric, or it may be semiconducting or insulating. The material of the strapping layer should be selectively etchable over nanofabric when used alone to open up a window of exposed fabric. Alternatively, as shown in FIGS. 3B-1 and 3B-2, intermediate structure 310 may be lithographically patterned to remove any suitable portion of the covering material 312 such that it contacts a portion of the fabric 302, as is shown in structure 340.

Figure 4A:
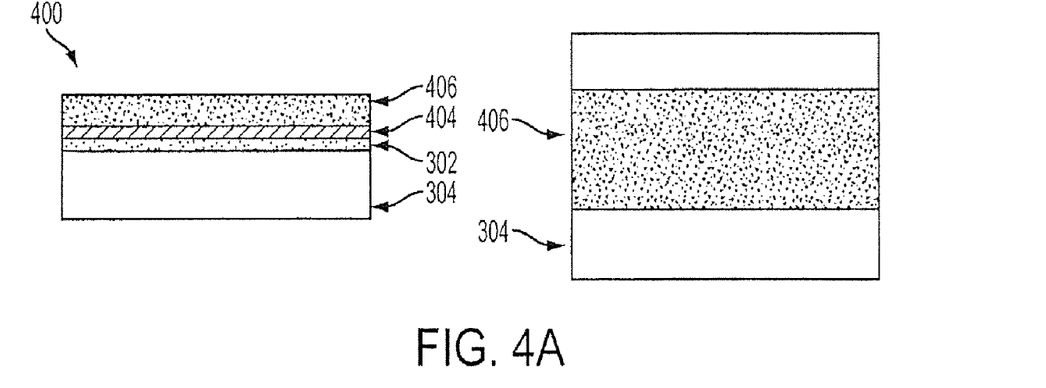
Figure 4B:
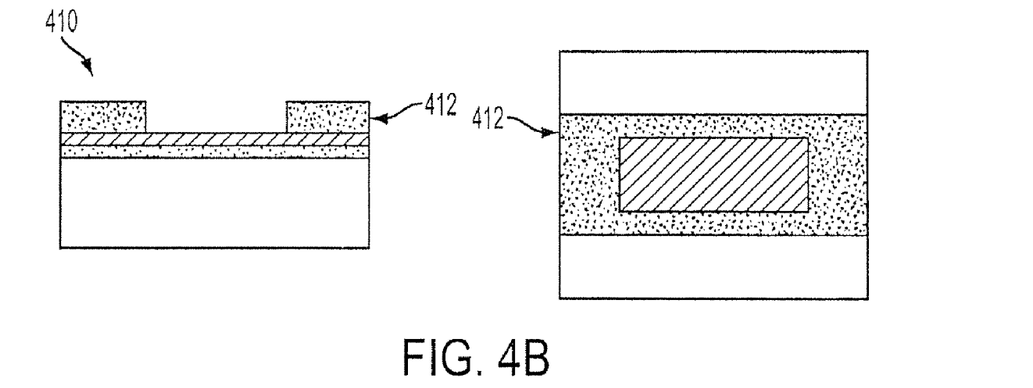
Figure 4C:
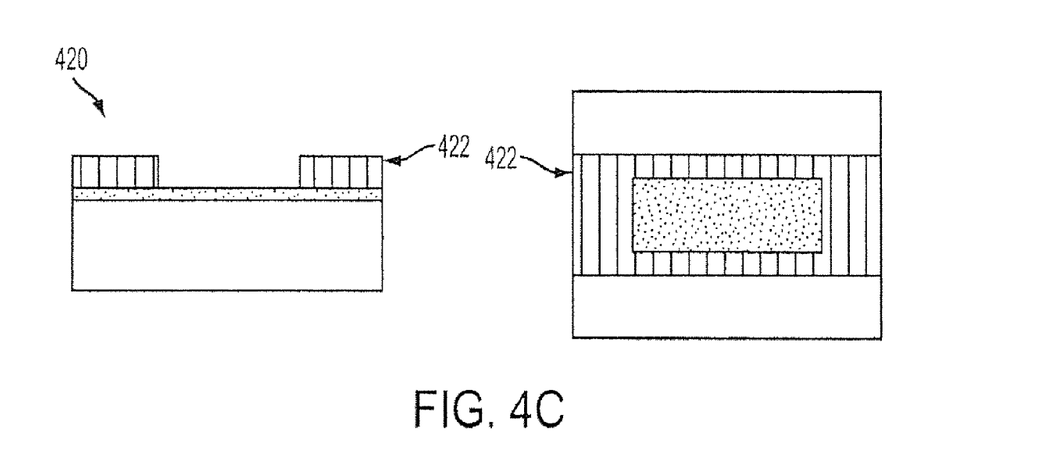

FIGS. 4A-4C illustrate yet another method of patterning nanofabrics on a substrate 304. As illustrated in intermediate structure 400, such a method involves a covering material 406 that is selectively etchable over an intermediate layer 404. Covering material 406 is preferably metal, and intermediate layer is preferably a semiconductor, e.g., silicon, however any suitable material for the application will work. The intermediate layer 404 is disposed between the nanofabric 302 and covering layer 406. The intermediate layer 404 in this case may act as an etch stop when dry etching and patterning the covering layer 406. Intermediate structure 410 illustrates patterned covering layer 412 in the shape of a frame, however any pattern will work depending on the requirements of the final product. Intermediate structure 410 is subjected to an annealing step (forming structure 420) whereby covering layer 406 and intermediate layer form a conducting composite layer 422, e.g., a metal silicide. Such a composite layer can act as stitching electrode or other contact or addressing element, depending on the use of the final product.

Figure 5A:
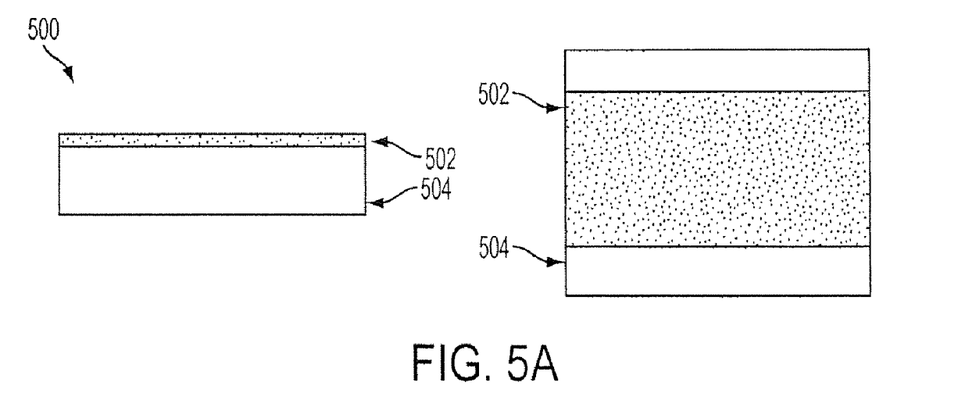
FIGS. 5A-5C illustrate steps for patterning nanowire fabrics in accordance with some embodiments of the invention.
Figure 5B:
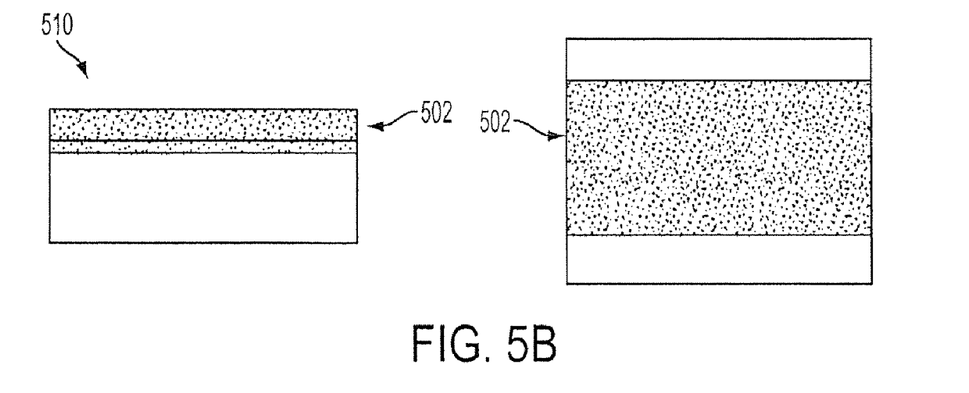
Figure 5C:
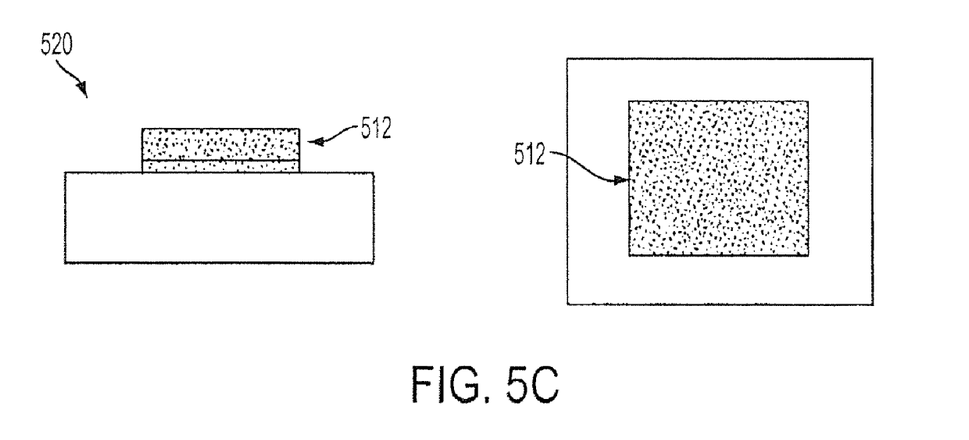

FIGS. 5A-5C illustrate steps in yet another method of patterning nanofabrics. According to one embodiment, the method involves providing nanotube fabric 302 over substrate 504, as illustrated by intermediate structure 500. Such a method involves the use of a covering material 502 which is not differently etchable over the nanofabric (in respect to at least one etchant) as illustrated by intermediate structure 510. One mask is used to pattern both the covering layer 502 and the nanofabric 302. A frame may be created using an appropriate etchant as in FIGS. 3A-3B; however use of such an etchant in this step requires that the fabric 302 be selectively etchable over the covering layer 502, forming structure 520 having patterned covering layer 512.

Other Embodiments

In another embodiment, pinning of nanowires onto the supports using an overlaid thin coating is done to prevent slipping of tubes during operation. Porous nature of nanowire fabrics allows materials to be evaporated over and through the fabric. Materials can also be etched below the fabric.

The electrical properties of the layers and electrically conductive articles can be tuned by controlling the cross section of the nanowire ribbons. For example, the ribbon thickness may be increased at a given width and nanowire density. The higher the cross section, the greater the number of conduction channels leading to enhanced electrical properties.

In a further embodiment one can envision using a "negative" growth method whereby the lithographically patterned substrate contains a metallic or other material which does not support nanowire growth. When a proper gas-phase precursor such as a metallocene or similar compound is supplied the nanowires would substantively grow only in the regions without the patterned material. The removal of an underlying material could provide suspended nanowires or interconnect structures upon the removal of the patterned metallic species.

The method of preparing of the nanowire ribbons allows continuous conductivity even over rough surface topologies. In contrast, typical evaporation of metallic electrodes would suffer from structural and thus, electrical defects.

Methods to increase the adhesion energies through the use of ionic, covalent or other forces can be envisioned to alter the interactions with the electrode surfaces. These methods can be used to extend the range of bistability with these junctions.

In yet a further embodiment, the property of nanowires to adhere to non-planar surfaces is exploited. Depending on the composition and thickness of the nanowires used, the fabric made by spin coating or other application may substantially conform to a non-planar surface. (e.g., a fabric made from silicon nanowires, 5 nm in diameter, will conform to the peaks and valleys of a non-planar surface, while a fabric made using silicon nanowires greater than 20 nm in diameter, which remain more rigid than 5 nm nanowires, will not conform as well.)

This application is related to the following references, which are assigned to the assignee of this application and are hereby incorporated by reference herein in their entireties:

Electromechanical Memory Array Using Nanotube Ribbons and Method for Making Same (U.S. patent application Ser. No. 09/915,093, now U.S. Pat. No. 6,919,592), filed on Jul. 25, 2001;

Electromechanical Memory Having Cell Selection Circuitry Constructed With Nanotube Technology (U.S. patent application Ser. No. 09/915,173, now U.S. Pat. No. 6,643,165), filed on Jul. 25, 2001;

Hybrid Circuit Having Nanotube Electromechanical Memory (U.S. patent application Ser. No. 09/915,095, now U.S. Pat. No. 6,574,130), filed on Jul. 25, 2001;

Electromechanical Three-Trace Junction Devices (U.S. patent application Ser. No. 10/033,323, now U.S. Pat. No. 6,911,682), filed on Dec. 28, 2001;

Methods of Making Electromechanical Three-Trace Junction Devices (U.S. patent application Ser. No. 10/033,032, now U.S. Pat. No. 6,784,028), filed on Dec. 28, 2001;

Nanotube Films and Articles (U.S. patent application Ser. No. 10/128,118, now U.S. Pat. No. 6,706,402), filed Apr. 23, 2002;

Methods of Nanotube Films and Articles (U.S. patent application Ser. No. 10/128,117, now U.S. Pat. No. 6,835,591), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341,054, now U.S. Pat. No. 7,335,395), filed Jan. 13, 2003;

Carbon Nanotube Films, Layers, Fabrics, Ribbons, Elements and Articles (U.S. patent application Ser. No. 10/341,130), filed Jan. 13, 2003;

Non-volatile Electromechanical Field Effect Devices and Circuits using Same and Methods of Forming Same (U.S. patent application Ser. No. 10/864,186, now U.S. Pat. No. 7,115,901), filed Jun. 9, 2004;

Electro-Mechanical Switches and Memory Cells Using Horizontally-Disposed Nanofabric Articles and Methods of Making the Same, (U.S. Provisional Pat. Apl. Ser. No. 60/446,783), filed Feb. 12, 2003;

Electromechanical Switches and Memory Cells using Vertically-Disposed Nanofabric Articles and Methods of Making the Same (U.S. Provisional Pat. Apl. Ser. No. 60/446,786), filed Feb. 12, 2003; and Non-volatile Electromechanical Field Effect Devices and Circuits using Same and Methods of Forming Same (U.S. Provisional Pat. Apl. Ser. No. 60/476,976), filed Jun. 9, 2003.

It will be further appreciated that the scope of the present invention is not limited to the above-described embodiments but rather is defined by the appended claims, and that these claims will encompass modifications of and improvements to what has been described.

What is claimed is:

1. A conductive article comprising:
   a plurality of inter-contacting carbon nanomaterial fibers defining a plurality of conductive pathways; and
   a lithographically-patterned thin metal layer that is positioned to contact a portion of the plurality of inter-contacting carbon nanomaterial fibers.

2. The article of claim 1, wherein the plurality of carbon nanomaterial fibers include nanowire segments.

3. The article of claim 2, wherein the nanowire segments include at least one of metallic nanowire segments and semiconducting nanowire segments.

4. The article of claim 2, wherein the plurality of nanowire segments have different lengths.

5. The article of claim 2, wherein the plurality of nanowire segments include segments having a length shorter than the length of the article.

6. The article of claim 1, wherein the plurality of carbon nanomaterial fibers include nanotube segments.

7. The article of claim 6, wherein the nanotube segments include single-walled carbon nanotubes.

8. The article of claim 6, wherein the nanotube segments include multi-walled carbon nanotubes.

9. The article of claim 1, wherein the plurality of carbon nanomaterial fibers include nanowire segments entangled with nanotube segments.

10. The article of claim 1, further comprising semiconducting nanomaterials interposed in porous regions among the plurality of inter-contacting carbon nanomaterial fibers.

11. The article of claim 1, further comprising metallic nanomaterials interposed in porous regions among the plurality of inter-contacting carbon nanomaterial fibers.

12. The article of claim 1, further comprising insulating nanomaterials interposed in porous regions among the plurality of inter-contacting carbon nanomaterial fibers.

13. The article of claim 1, further comprising support nanomaterials interposed in porous regions among the plurality of inter-contacting carbon nanomaterial fibers, the support materials including at least one of: carbon, silicon dioxide, silicon nitride, silicon, aluminum, tungsten, titanium, copper, gold, silver, and molybdenum.

14. The article of claim 1, wherein the thin metal layer contacts the periphery of the plurality of inter-contacting carbon nanomaterial fibers.

15. The article of claim 1, wherein the thin metal layer is lithographically patterned in the shape of a frame with an opening that exposes an area of the plurality of inter-contacting nanowire segments.

16. The article of claim 1, wherein the article is disposed on a substrate.

17. The article of claim 1, wherein the thin metal layer is vertically aligned with the plurality of inter-contacting carbon nanomaterial fibers.

18. A conductive article comprising:
   a defined pattern of nanomaterials, the nanomaterials including a mixture of carbon fibers forming a network having a resistance; and
   a lithographically patterned thin metal layer that is positioned to contact a portion of the defined pattern of nanomaterials;
   wherein the conductive article is constructed and arranged such that the resistance of the defined pattern of nanomaterials is selectively controlled.

19. The article of claim 18, wherein the carbon fibers included nanotubes.

20. The article of claim 18, wherein the carbon fibers include nanowires.

21. The article of claim 20, wherein the nanowires include metallic nanowires.

22. The article of claim 20, wherein the nanowires include semiconducting nanowires.

23. The article of claim 18, wherein the carbon fibers are arranged in a network of a selected density to form a network having the selectively controlled resistance.

24. The article of claim 18, wherein the thin metal layer contacts the periphery of the defined pattern of nanomaterials.

25. The article of claim 18, wherein the thin metal layer is lithographically patterned in the shape of a frame with an opening that exposes an area of nanomaterials.

26. The article of claim 18, wherein the article is disposed on a substrate.

27. The article of claim 18, wherein the thin metal layer is vertically aligned with the nanomaterials.

28. The article of claim 18, wherein the adhesion energy of one or more surfaces of the thin metal layer positioned to contact a portion of the nanomaterials is controlled such that a resistance of the article is selectively controlled.

29. The article of claim 18, wherein the mixture of carbon fibers forming the network is selected such that said resistance of the defined pattern of nanomaterials is selectively controlled.

30. The article of claim 18, wherein the lithographically patterned thin metal layer is deposited overlying and at least partially through the portion of the defined pattern of nanomaterials.

31. The article of claim 30, wherein the thin metal layer constructed and arranged to decrease the resistance of the defined pattern of nanomaterials.

32. The article of claim 18, further comprising support nanomaterials interposed in porous regions among the mixture of carbon fibers forming the network, the support materials including at least one of: carbon, silicon dioxide, silicon nitride, silicon, aluminum, tungsten, titanium, copper, gold, silver, and molybdenum.

* * * * *